United States Patent
Bergemont et al.

(10) Patent No.: US 11,609,131 B2
(45) Date of Patent: Mar. 21, 2023

(54) WAFER BONDED PIEZORESISTIVE AND PIEZOELECTRIC FORCE SENSOR AND RELATED METHODS OF MANUFACTURE

(71) Applicant: NEXTINPUT, INC., Mountain View, CA (US)

(72) Inventors: Albert Bergemont, Palo Alto, CA (US); Julius Minglin Tsai, San Jose, CA (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 17/591,706

(22) Filed: Feb. 3, 2022

(65) Prior Publication Data

US 2022/0260435 A1 Aug. 18, 2022

Related U.S. Application Data

(63) Continuation of application No. 16/634,469, filed as application No. PCT/US2018/044049 on Jul. 27, 2018, now Pat. No. 11,243,126.

(60) Provisional application No. 62/537,614, filed on Jul. 27, 2017.

(51) Int. Cl.
*G01L 1/16* (2006.01)
*G01L 1/18* (2006.01)
*H01L 41/113* (2006.01)

(52) U.S. Cl.
CPC ............... *G01L 1/16* (2013.01); *G01L 1/18* (2013.01); *H01L 41/1132* (2013.01)

(58) Field of Classification Search
CPC ....... H01L 27/18; H01L 41/1132; G01L 1/16; G01L 1/18

USPC ...................................... 73/514.32
See application file for complete search history.

(56) References Cited

U.S. PATENT DOCUMENTS

| | | | |
|---|---|---|---|
| 4,276,533 | A | 6/1981 | Tominaga et al. |
| 4,594,639 | A | 6/1986 | Kuisma |
| 4,658,651 | A | 4/1987 | Le |
| 4,814,856 | A | 3/1989 | Kurtz et al. |

(Continued)

FOREIGN PATENT DOCUMENTS

| CN | 101341459 A | 1/2009 |
|---|---|---|
| CN | 101458134 A | 6/2009 |

(Continued)

OTHER PUBLICATIONS

Non-Final Office Action for U.S. Appl. No. 16/485,026, dated Apr. 28, 2021, 13 pages.

(Continued)

*Primary Examiner* — Octavia Davis Hollington
(74) *Attorney, Agent, or Firm* — Withrow & Terranova, P.L.L.C.

(57) ABSTRACT

Described herein is a ruggedized microelectromechanical ("MEMS") force sensor. The sensor employs piezoresistive or piezoelectric sensing elements for force sensing where the force is converted to strain and converted to electrical signal. In one aspect, both the piezoresistive and the piezoelectric sensing elements are formed on one substrate and later bonded to another substrate on which the integrated circuitry is formed. In another aspect, the piezoelectric sensing element is formed on one substrate and later bonded to another substrate on which both the piezoresistive sensing element and the integrated circuitry are formed.

20 Claims, 8 Drawing Sheets

(56) References Cited

U.S. PATENT DOCUMENTS

| | | |
|---|---|---|
| 4,842,685 A | 6/1989 | Adams |
| 4,849,730 A | 7/1989 | Izumi et al. |
| 4,914,624 A | 4/1990 | Dunthorn |
| 4,918,262 A | 4/1990 | Flowers et al. |
| 4,933,660 A | 6/1990 | Wynne, Jr. |
| 4,983,786 A | 1/1991 | Stevens et al. |
| 5,095,401 A | 3/1992 | Zavracky et al. |
| 5,159,159 A | 10/1992 | Asher |
| 5,166,612 A | 11/1992 | Murdock |
| 5,237,879 A | 8/1993 | Speeter |
| 5,291,795 A | 3/1994 | Hafner |
| 5,320,705 A | 6/1994 | Fujii et al. |
| 5,333,505 A | 8/1994 | Takahashi et al. |
| 5,343,220 A | 8/1994 | Veasy et al. |
| 5,349,746 A | 9/1994 | Gruenwald et al. |
| 5,351,550 A | 10/1994 | Maurer |
| 5,483,994 A | 1/1996 | Maurer |
| 5,510,812 A | 4/1996 | O'Mara et al. |
| 5,541,372 A | 7/1996 | Baller et al. |
| 5,543,591 A | 8/1996 | Gillespie et al. |
| 5,565,657 A | 10/1996 | Merz |
| 5,600,074 A | 2/1997 | Marek et al. |
| 5,661,245 A | 8/1997 | Svoboda et al. |
| 5,673,066 A | 9/1997 | Toda et al. |
| 5,679,882 A | 10/1997 | Gerlach et al. |
| 5,760,313 A | 6/1998 | Guentner et al. |
| 5,773,728 A | 6/1998 | Tsukada et al. |
| 5,889,236 A | 3/1999 | Gillespie et al. |
| 5,921,896 A | 7/1999 | Boland |
| 5,969,591 A | 10/1999 | Fung |
| 5,994,161 A | 11/1999 | Bitko et al. |
| 6,012,336 A | 1/2000 | Eaton et al. |
| 6,028,271 A | 2/2000 | Gillespie et al. |
| 6,159,166 A | 12/2000 | Chesney et al. |
| 6,243,075 B1 | 6/2001 | Fishkin et al. |
| 6,348,663 B1 | 2/2002 | Schoos et al. |
| 6,351,205 B1 | 2/2002 | Armstrong |
| 6,360,598 B1 | 3/2002 | Calame et al. |
| 6,437,682 B1 | 8/2002 | Vance |
| 6,555,235 B1 | 4/2003 | Aufderheide et al. |
| 6,556,189 B1 | 4/2003 | Takahata et al. |
| 6,569,108 B2 | 5/2003 | Sarvazyan et al. |
| 6,610,936 B2 | 8/2003 | Gillespie et al. |
| 6,620,115 B2 | 9/2003 | Sarvazyan et al. |
| 6,629,343 B1 | 10/2003 | Chesney et al. |
| 6,668,230 B2 | 12/2003 | Mansky et al. |
| 6,720,712 B2 | 4/2004 | Scott et al. |
| 6,788,297 B2 | 9/2004 | Itoh et al. |
| 6,801,191 B2 | 10/2004 | Mukai et al. |
| 6,809,280 B2 | 10/2004 | Divigalpitiya et al. |
| 6,812,621 B2 | 11/2004 | Scott |
| 6,822,640 B2 | 11/2004 | Derocher |
| 6,868,731 B1 | 3/2005 | Gatesman |
| 6,879,318 B1 | 4/2005 | Chan et al. |
| 6,888,537 B2 | 5/2005 | Benson et al. |
| 6,915,702 B2 | 7/2005 | Omura et al. |
| 6,931,938 B2 | 8/2005 | Knirck et al. |
| 6,946,742 B2 | 9/2005 | Karpman |
| 6,995,752 B2 | 2/2006 | Lu |
| 7,138,984 B1 | 11/2006 | Miles |
| 7,173,607 B2 | 2/2007 | Matsumoto et al. |
| 7,190,350 B2 | 3/2007 | Roberts |
| 7,215,329 B2 | 5/2007 | Yoshikawa et al. |
| 7,218,313 B2 | 5/2007 | Marcus et al. |
| 7,224,257 B2 | 5/2007 | Morikawa |
| 7,245,293 B2 | 7/2007 | Hoshino et al. |
| 7,273,979 B2 | 9/2007 | Christensen |
| 7,280,097 B2 | 10/2007 | Chen et al. |
| 7,318,349 B2 | 1/2008 | Vaganov et al. |
| 7,324,094 B2 | 1/2008 | Moilanen et al. |
| 7,324,095 B2 | 1/2008 | Sharma |
| 7,336,260 B2 | 2/2008 | Martin et al. |
| 7,337,085 B2 | 2/2008 | Soss |
| 7,343,233 B2 | 3/2008 | Min et al. |
| 7,345,680 B2 | 3/2008 | David |
| 7,367,232 B2 | 5/2008 | Vaganov et al. |
| 7,406,661 B2 | 7/2008 | Vaananen et al. |
| 7,425,749 B2 | 9/2008 | Hartzell et al. |
| 7,426,873 B1 | 9/2008 | Kholwadwala et al. |
| 7,449,758 B2 | 11/2008 | Axelrod et al. |
| 7,460,109 B2 | 12/2008 | Safai et al. |
| 7,476,952 B2 | 1/2009 | Vaganov et al. |
| 7,508,040 B2 | 3/2009 | Nikkei et al. |
| 7,554,167 B2 | 6/2009 | Vaganov |
| 7,571,647 B2 | 8/2009 | Takemasa et al. |
| 7,607,111 B2 | 10/2009 | Vaananen et al. |
| 7,620,521 B2 | 11/2009 | Breed et al. |
| 7,629,969 B2 | 12/2009 | Kent |
| 7,637,174 B2 | 12/2009 | Hirabayashi |
| 7,649,522 B2 | 1/2010 | Chen et al. |
| 7,663,612 B2 | 2/2010 | Bladt |
| 7,685,538 B2 | 3/2010 | Fleck et al. |
| 7,698,084 B2 | 4/2010 | Soss |
| 7,701,445 B2 | 4/2010 | Inokawa et al. |
| 7,746,327 B2 | 6/2010 | Miyakoshi |
| 7,772,657 B2 | 8/2010 | Vaganov |
| 7,791,151 B2 | 9/2010 | Vaganov et al. |
| 7,819,998 B2 | 10/2010 | David |
| 7,825,911 B2 | 11/2010 | Sano et al. |
| 7,829,960 B2 | 11/2010 | Takizawa |
| 7,832,284 B2 | 11/2010 | Hayakawa et al. |
| 7,880,247 B2 | 2/2011 | Vaganov et al. |
| 7,903,090 B2 | 3/2011 | Soss et al. |
| 7,921,725 B2 | 4/2011 | Silverbrook et al. |
| 7,938,028 B2 | 5/2011 | Hirabayashi et al. |
| 7,952,566 B2 | 5/2011 | Poupyrev et al. |
| 7,973,772 B2 | 7/2011 | Gettemy et al. |
| 7,973,778 B2 | 7/2011 | Chen |
| 8,004,052 B2 | 8/2011 | Vaganov |
| 8,004,501 B2 | 8/2011 | Harrison |
| 8,013,843 B2 | 9/2011 | Pryor |
| 8,026,906 B2 | 9/2011 | Molne et al. |
| 8,044,929 B2 | 10/2011 | Baldo et al. |
| 3,051,705 A1 | 11/2011 | Kobayakawa |
| 8,068,100 B2 | 11/2011 | Pryor |
| 8,072,437 B2 | 12/2011 | Miller et al. |
| 8,072,440 B2 | 12/2011 | Pryor |
| 8,096,188 B2 | 1/2012 | Wilner |
| 8,113,065 B2 | 2/2012 | Ohsato et al. |
| 8,120,586 B2 | 2/2012 | Hsu et al. |
| 8,120,588 B2 | 2/2012 | Klinghult |
| 8,130,207 B2 | 3/2012 | Nurmi et al. |
| 8,134,535 B2 | 3/2012 | Choi et al. |
| 8,139,038 B2 | 3/2012 | Chueh et al. |
| 8,144,133 B2 | 3/2012 | Wang et al. |
| 8,149,211 B2 | 4/2012 | Hayakawa et al. |
| 8,154,528 B2 | 4/2012 | Chen et al. |
| 8,159,473 B2 | 4/2012 | Cheng et al. |
| 8,164,573 B2 | 4/2012 | DaCosta et al. |
| 8,183,077 B2 | 5/2012 | Vaganov et al. |
| 8,184,093 B2 | 5/2012 | Tsuiki |
| 8,188,985 B2 | 5/2012 | Hillis et al. |
| 8,196,477 B2 | 6/2012 | Ohsato et al. |
| 8,199,116 B2 | 6/2012 | Jeon et al. |
| 8,212,790 B2 | 7/2012 | Rimas Ribikauskas et al. |
| 8,220,330 B2 | 7/2012 | Miller et al. |
| 8,237,537 B2 | 8/2012 | Kurtz |
| 8,243,035 B2 | 8/2012 | Abe et al. |
| 8,250,921 B2 | 8/2012 | Nasir et al. |
| 8,253,699 B2 | 8/2012 | Son |
| 8,260,337 B2 | 9/2012 | Periyalwar et al. |
| 8,269,731 B2 | 9/2012 | Molne |
| 8,289,288 B2 | 10/2012 | Whytock et al. |
| 8,289,290 B2 | 10/2012 | Klinghult |
| 8,297,127 B2 | 10/2012 | Wade et al. |
| 8,316,533 B2 | 11/2012 | Suminto et al. |
| 8,319,739 B2 | 11/2012 | Chu et al. |
| 8,325,143 B2 | 12/2012 | Destura et al. |
| 8,350,345 B2 | 1/2013 | Vaganov |
| 8,363,020 B2 | 1/2013 | Li et al. |
| 8,363,022 B2 | 1/2013 | Tho et al. |
| 8,378,798 B2 | 2/2013 | Bells et al. |
| 8,378,991 B2 | 2/2013 | Jeon et al. |
| 8,384,677 B2 | 2/2013 | Mak-Fan et al. |

(56) References Cited

U.S. PATENT DOCUMENTS

| | | |
|---|---|---|
| 8,387,464 B2 | 3/2013 | McNeil et al. |
| 8,405,631 B2 | 3/2013 | Chu et al. |
| 8,405,632 B2 | 3/2013 | Chu et al. |
| 8,421,609 B2 | 4/2013 | Kim et al. |
| 8,427,441 B2 | 4/2013 | Paleczny et al. |
| 8,436,806 B2 | 5/2013 | Almalki et al. |
| 8,436,827 B1 | 5/2013 | Zhai et al. |
| 8,448,531 B2 | 5/2013 | Schneider |
| 8,451,245 B2 | 5/2013 | Heubel et al. |
| 8,456,440 B2 | 6/2013 | Abe et al. |
| 8,466,889 B2 | 6/2013 | Tong et al. |
| 8,477,115 B2 | 7/2013 | Rekimoto |
| 8,482,372 B2 | 7/2013 | Kurtz et al. |
| 8,493,189 B2 | 7/2013 | Suzuki |
| 8,497,757 B2 | 7/2013 | Kurtz et al. |
| 8,516,906 B2 | 8/2013 | Umetsu et al. |
| 8,646,335 B2 | 2/2014 | Kotovsky |
| 8,833,172 B2 | 9/2014 | Chiou |
| 8,931,347 B2 | 1/2015 | Donzier et al. |
| 8,973,446 B2 | 3/2015 | Fukuzawa et al. |
| 8,984,951 B2 | 3/2015 | Landmann et al. |
| 8,991,265 B2 | 3/2015 | Dekker et al. |
| 9,032,818 B2 | 5/2015 | Campbell et al. |
| 9,097,600 B2 | 8/2015 | Khandani |
| 9,143,057 B1 | 9/2015 | Shah et al. |
| 9,182,302 B2 | 11/2015 | Lim et al. |
| 9,366,588 B2 | 6/2016 | Lee |
| 9,377,372 B2 | 6/2016 | Ogawa |
| 9,425,328 B2 | 8/2016 | Marx et al. |
| 9,446,944 B2 | 9/2016 | Ernst et al. |
| 9,464,952 B2 | 10/2016 | Pagani et al. |
| 9,487,388 B2 | 11/2016 | Brosh |
| 9,493,342 B2 | 11/2016 | Brosh |
| 9,574,954 B2 | 2/2017 | Baker et al. |
| 9,709,509 B1 | 7/2017 | Yang |
| 9,728,652 B2 | 8/2017 | Elian et al. |
| 9,772,245 B2 | 9/2017 | Besling et al. |
| 9,778,117 B2 | 10/2017 | Pagani |
| 9,791,303 B2 | 10/2017 | Pagani et al. |
| 9,823,144 B2 | 11/2017 | Fujisawa et al. |
| 9,835,515 B2 | 12/2017 | Pagani |
| 9,846,091 B2 | 12/2017 | Lu et al. |
| 9,851,266 B2 | 12/2017 | Nakamura et al. |
| 9,902,611 B2 | 2/2018 | Brosh et al. |
| 9,970,831 B2 | 5/2018 | Shih |
| 9,983,084 B2 | 5/2018 | Pavone |
| 10,024,738 B2 | 7/2018 | Conti et al. |
| 10,067,014 B1 | 9/2018 | Tung et al. |
| 10,113,925 B2 | 10/2018 | Lai et al. |
| 10,488,284 B2 | 11/2019 | Jentoft et al. |
| 10,496,209 B2 | 12/2019 | Vummidi Murali et al. |
| 10,598,578 B2 | 3/2020 | Pagani et al. |
| 10,724,909 B2 | 7/2020 | Abbasi Gavarti et al. |
| 10,962,427 B2 | 3/2021 | Youssefi et al. |
| 11,255,737 B2 * | 2/2022 | Foughi ............... H01L 27/20 |
| 11,385,108 B2 * | 7/2022 | Tsai ..................... G01L 1/18 |
| 2001/0009112 A1 | 7/2001 | Delaye |
| 2003/0067448 A1 | 4/2003 | Park |
| 2003/0128181 A1 | 7/2003 | Poole |
| 2003/0189552 A1 | 10/2003 | Chuang et al. |
| 2004/0012572 A1 | 1/2004 | Sowden et al. |
| 2004/0140966 A1 | 7/2004 | Marggraff et al. |
| 2005/0083310 A1 | 4/2005 | Safai et al. |
| 2005/0166687 A1 | 8/2005 | Kaneko et al. |
| 2005/0190152 A1 | 9/2005 | Vaganov |
| 2006/0028441 A1 | 2/2006 | Armstrong |
| 2006/0244733 A1 | 11/2006 | Geaghan |
| 2006/0272413 A1 | 12/2006 | Vaganov et al. |
| 2006/0284856 A1 | 12/2006 | Soss |
| 2007/0035525 A1 | 2/2007 | Yeh et al. |
| 2007/0046649 A1 | 3/2007 | Reiner |
| 2007/0070046 A1 | 3/2007 | Sheynblat et al. |
| 2007/0070053 A1 | 3/2007 | Lapstun et al. |
| 2007/0097095 A1 | 5/2007 | Kim et al. |
| 2007/0103449 A1 | 5/2007 | Laitinen et al. |
| 2007/0103452 A1 | 5/2007 | Wakai et al. |
| 2007/0115265 A1 | 5/2007 | Rainisto |
| 2007/0132717 A1 | 6/2007 | Wang et al. |
| 2007/0137901 A1 | 6/2007 | Chen |
| 2007/0139391 A1 | 6/2007 | Bischoff |
| 2007/0152959 A1 | 7/2007 | Peters |
| 2007/0156723 A1 | 7/2007 | Vaananen |
| 2007/0182864 A1 | 8/2007 | Stoneham et al. |
| 2007/0229478 A1 | 10/2007 | Rosenberg et al. |
| 2007/0235231 A1 | 10/2007 | Loomis et al. |
| 2007/0245836 A1 | 10/2007 | Vaganov |
| 2007/0262965 A1 | 11/2007 | Hirai et al. |
| 2007/0277616 A1 | 12/2007 | Nikkei et al. |
| 2007/0298883 A1 | 12/2007 | Feldman et al. |
| 2008/0001923 A1 | 1/2008 | Hall et al. |
| 2008/0007532 A1 | 1/2008 | Chen |
| 2008/0010616 A1 | 1/2008 | Algreatly |
| 2008/0024454 A1 | 1/2008 | Everest |
| 2008/0030482 A1 | 2/2008 | Elwell et al. |
| 2008/0036743 A1 | 2/2008 | Westerman et al. |
| 2008/0083962 A1 | 4/2008 | Vaganov |
| 2008/0088600 A1 | 4/2008 | Prest et al. |
| 2008/0088602 A1 | 4/2008 | Hotelling |
| 2008/0094367 A1 | 4/2008 | Van De Ven et al. |
| 2008/0105057 A1 | 5/2008 | Wade |
| 2008/0105470 A1 | 5/2008 | Van De Ven et al. |
| 2008/0106523 A1 | 5/2008 | Conrad |
| 2008/0174852 A1 | 7/2008 | Hirai et al. |
| 2008/0180402 A1 | 7/2008 | Yoo et al. |
| 2008/0180405 A1 | 7/2008 | Han et al. |
| 2008/0180406 A1 | 7/2008 | Han et al. |
| 2008/0202249 A1 | 8/2008 | Yokura et al. |
| 2008/0204427 A1 | 8/2008 | Heesemans et al. |
| 2008/0211766 A1 | 9/2008 | Westerman et al. |
| 2008/0238446 A1 | 10/2008 | DeNatale et al. |
| 2008/0238884 A1 | 10/2008 | Harish |
| 2008/0259046 A1 | 10/2008 | Carsanaro |
| 2008/0284742 A1 | 11/2008 | Prest et al. |
| 2008/0303799 A1 | 12/2008 | Schwesig et al. |
| 2009/0027352 A1 | 1/2009 | Abele |
| 2009/0027353 A1 | 1/2009 | Im et al. |
| 2009/0046110 A1 | 2/2009 | Sadler et al. |
| 2009/0078040 A1 | 3/2009 | Ike et al. |
| 2009/0102805 A1 | 4/2009 | Meijer et al. |
| 2009/0140985 A1 | 6/2009 | Liu |
| 2009/0184921 A1 | 7/2009 | Scott et al. |
| 2009/0184936 A1 | 7/2009 | Algreatly |
| 2009/0213066 A1 | 8/2009 | Hardacker et al. |
| 2009/0237275 A1 | 9/2009 | Vaganov |
| 2009/0237374 A1 | 9/2009 | Li et al. |
| 2009/0242282 A1 | 10/2009 | Kim et al. |
| 2009/0243817 A1 | 10/2009 | Son |
| 2009/0243998 A1 | 10/2009 | Wang |
| 2009/0256807 A1 | 10/2009 | Nurmi |
| 2009/0256817 A1 | 10/2009 | Perlin et al. |
| 2009/0282930 A1 | 11/2009 | Cheng et al. |
| 2009/0303400 A1 | 12/2009 | Hou et al. |
| 2009/0309852 A1 | 12/2009 | Lin et al. |
| 2009/0314551 A1 | 12/2009 | Nakajima |
| 2010/0013785 A1 | 1/2010 | Murai et al. |
| 2010/0020030 A1 | 1/2010 | Kim et al. |
| 2010/0020039 A1 | 1/2010 | Ricks et al. |
| 2010/0039396 A1 | 2/2010 | Ho et al. |
| 2010/0053087 A1 | 3/2010 | Dai et al. |
| 2010/0053116 A1 | 3/2010 | Daverman et al. |
| 2010/0066686 A1 | 3/2010 | Joguet et al. |
| 2010/0066697 A1 | 3/2010 | Jacomet et al. |
| 2010/0079391 A1 | 4/2010 | Joung |
| 2010/0079395 A1 | 4/2010 | Kim et al. |
| 2010/0079398 A1 | 4/2010 | Shen et al. |
| 2010/0097347 A1 | 4/2010 | Lin |
| 2010/0102403 A1 | 4/2010 | Celik-Butler et al. |
| 2010/0117978 A1 | 5/2010 | Shirado |
| 2010/0123671 A1 | 5/2010 | Lee |
| 2010/0123686 A1 | 5/2010 | Klinghult et al. |
| 2010/0127140 A1 | 5/2010 | Smith |
| 2010/0128002 A1 | 5/2010 | Stacy et al. |
| 2010/0153891 A1 | 6/2010 | Vaananen et al. |
| 2010/0164959 A1 | 7/2010 | Brown et al. |

(56) References Cited

U.S. PATENT DOCUMENTS

| | | |
|---|---|---|
| 2010/0220065 A1 | 9/2010 | Ma |
| 2010/0224004 A1 | 9/2010 | Suminto et al. |
| 2010/0271325 A1 | 10/2010 | Conte et al. |
| 2010/0289807 A1 | 11/2010 | Yu et al. |
| 2010/0295807 A1 | 11/2010 | Xie et al. |
| 2010/0308844 A1 | 12/2010 | Day et al. |
| 2010/0309714 A1 | 12/2010 | Meade |
| 2010/0315373 A1 | 12/2010 | Steinhauser et al. |
| 2010/0321310 A1 | 12/2010 | Kim et al. |
| 2010/0321319 A1 | 12/2010 | Hefti |
| 2010/0323467 A1 | 12/2010 | Vaganov |
| 2010/0328229 A1 | 12/2010 | Weber et al. |
| 2010/0328230 A1 | 12/2010 | Faubert et al. |
| 2011/0001723 A1 | 1/2011 | Fan |
| 2011/0006980 A1 | 1/2011 | Taniguchi et al. |
| 2011/0007008 A1 | 1/2011 | Algreatly |
| 2011/0012848 A1 | 1/2011 | Li et al. |
| 2011/0018820 A1 | 1/2011 | Huitema et al. |
| 2011/0032211 A1 | 2/2011 | Christofferson |
| 2011/0039602 A1 | 2/2011 | McNamara et al. |
| 2011/0050628 A1 | 3/2011 | Homma et al. |
| 2011/0050630 A1 | 3/2011 | Ikeda |
| 2011/0057899 A1 | 3/2011 | Sleeman et al. |
| 2011/0063248 A1 | 3/2011 | Yoon |
| 2011/0113881 A1 | 5/2011 | Suzuki |
| 2011/0128250 A1 | 6/2011 | Murphy et al. |
| 2011/0141052 A1 | 6/2011 | Bernstein et al. |
| 2011/0141053 A1 | 6/2011 | Bulea et al. |
| 2011/0187674 A1 | 8/2011 | Baker et al. |
| 2011/0209555 A1 | 9/2011 | Ahles et al. |
| 2011/0227836 A1 | 9/2011 | Li et al. |
| 2011/0242014 A1 | 10/2011 | Tsai et al. |
| 2011/0267181 A1 | 11/2011 | Kildal |
| 2011/0267294 A1 | 11/2011 | Kildal |
| 2011/0273396 A1 | 11/2011 | Chung |
| 2011/0291951 A1 | 12/2011 | Tong |
| 2011/0298705 A1 | 12/2011 | Vaganov |
| 2011/0308324 A1 | 12/2011 | Gamage et al. |
| 2012/0025337 A1 | 2/2012 | Leclair et al. |
| 2012/0032907 A1 | 2/2012 | Koizumi et al. |
| 2012/0032915 A1 | 2/2012 | Wittorf |
| 2012/0038579 A1 | 2/2012 | Sasaki |
| 2012/0044169 A1 | 2/2012 | Enami |
| 2012/0044172 A1 | 2/2012 | Ohki et al. |
| 2012/0050159 A1 | 3/2012 | Yu et al. |
| 2012/0050208 A1 | 3/2012 | Dietz |
| 2012/0056837 A1 | 3/2012 | Park et al. |
| 2012/0060605 A1 | 3/2012 | Wu et al. |
| 2012/0061823 A1 | 3/2012 | Wu et al. |
| 2012/0062603 A1 | 3/2012 | Mizunuma et al. |
| 2012/0068946 A1 | 3/2012 | Tang et al. |
| 2012/0068969 A1 | 3/2012 | Bogana et al. |
| 2012/0081327 A1 | 4/2012 | Heubel et al. |
| 2012/0086659 A1 | 4/2012 | Perlin et al. |
| 2012/0092250 A1 | 4/2012 | Hadas et al. |
| 2012/0092279 A1 | 4/2012 | Martin |
| 2012/0092294 A1 | 4/2012 | Ganapathi et al. |
| 2012/0092299 A1 | 4/2012 | Harada et al. |
| 2012/0092324 A1 | 4/2012 | Buchan et al. |
| 2012/0105358 A1 | 5/2012 | Momeyer et al. |
| 2012/0105367 A1 | 5/2012 | Son et al. |
| 2012/0113061 A1 | 5/2012 | Ikeda |
| 2012/0127088 A1 | 5/2012 | Pance et al. |
| 2012/0127107 A1 | 5/2012 | Miyashita et al. |
| 2012/0139864 A1 | 6/2012 | Sleeman et al. |
| 2012/0144921 A1 | 6/2012 | Bradley et al. |
| 2012/0146945 A1 | 6/2012 | Miyazawa et al. |
| 2012/0146946 A1 | 6/2012 | Wang et al. |
| 2012/0147052 A1 | 6/2012 | Homma et al. |
| 2012/0154315 A1 | 6/2012 | Bradley et al. |
| 2012/0154316 A1 | 6/2012 | Kono |
| 2012/0154317 A1 | 6/2012 | Aono |
| 2012/0154318 A1 | 6/2012 | Aono |
| 2012/0154328 A1 | 6/2012 | Kono |
| 2012/0154329 A1 | 6/2012 | Shinozaki |
| 2012/0154330 A1 | 6/2012 | Shimizu |
| 2012/0162122 A1 | 6/2012 | Geaghan |
| 2012/0169609 A1 | 7/2012 | Britton |
| 2012/0169617 A1 | 7/2012 | Maenpaa |
| 2012/0169635 A1 | 7/2012 | Liu |
| 2012/0169636 A1 | 7/2012 | Liu |
| 2012/0180575 A1 | 7/2012 | Sakano et al. |
| 2012/0188181 A1 | 7/2012 | Ha et al. |
| 2012/0194460 A1 | 8/2012 | Kuwabara et al. |
| 2012/0194466 A1 | 8/2012 | Posamentier |
| 2012/0200526 A1 | 8/2012 | Lackey |
| 2012/0204653 A1 | 8/2012 | August et al. |
| 2012/0205165 A1 | 8/2012 | Strittmatter et al. |
| 2012/0218212 A1 | 8/2012 | Yu et al. |
| 2012/0234112 A1 | 9/2012 | Umetsu et al. |
| 2012/0256237 A1 | 10/2012 | Lakamraju et al. |
| 2012/0286379 A1 | 11/2012 | Inoue |
| 2012/0319987 A1 | 12/2012 | Woo |
| 2012/0327025 A1 | 12/2012 | Huska et al. |
| 2013/0008263 A1 | 1/2013 | Kabasawa et al. |
| 2013/0038541 A1 | 2/2013 | Bakker |
| 2013/0093685 A1 | 4/2013 | Kalu et al. |
| 2013/0096849 A1 | 4/2013 | Campbell et al. |
| 2013/0140944 A1* | 6/2013 | Chen .................... H02N 1/006 310/300 |
| 2013/0187201 A1 | 7/2013 | Elian et al. |
| 2013/0239700 A1 | 9/2013 | Benfield et al. |
| 2013/0255393 A1 | 10/2013 | Fukuzawa et al. |
| 2013/0341741 A1 | 12/2013 | Brosh |
| 2013/0341742 A1 | 12/2013 | Brosh |
| 2014/0007705 A1 | 1/2014 | Campbell et al. |
| 2014/0028575 A1 | 1/2014 | Parivar et al. |
| 2014/0055407 A1 | 2/2014 | Lee et al. |
| 2014/0090488 A1 | 4/2014 | Taylor et al. |
| 2014/0109693 A1 | 4/2014 | Sakai |
| 2014/0230563 A1 | 8/2014 | Huang |
| 2014/0260678 A1 | 9/2014 | Jentoft et al. |
| 2014/0283604 A1 | 9/2014 | Najafi et al. |
| 2014/0367811 A1 | 12/2014 | Nakagawa et al. |
| 2015/0110295 A1 | 4/2015 | Jenkner et al. |
| 2015/0226618 A1 | 8/2015 | Shih |
| 2015/0241465 A1 | 8/2015 | Konishi |
| 2015/0362389 A1 | 12/2015 | Yanev et al. |
| 2016/0069927 A1 | 3/2016 | Hamamura |
| 2016/0103545 A1 | 4/2016 | Filiz et al. |
| 2016/0245667 A1 | 8/2016 | Najafi et al. |
| 2016/0332866 A1 | 11/2016 | Brosh et al. |
| 2016/0354589 A1 | 12/2016 | Kobayashi et al. |
| 2016/0363490 A1 | 12/2016 | Campbell et al. |
| 2017/0103246 A1 | 4/2017 | Pi et al. |
| 2017/0205303 A1 | 7/2017 | Sanden et al. |
| 2017/0233245 A1 | 8/2017 | Duqi et al. |
| 2017/0234744 A1 | 8/2017 | Tung et al. |
| 2018/0058914 A1 | 3/2018 | Iesato |
| 2018/0058955 A1 | 3/2018 | Wade et al. |
| 2019/0330053 A1 | 10/2019 | Tseng et al. |
| 2019/0383675 A1 | 12/2019 | Tsai et al. |
| 2020/0149983 A1 | 5/2020 | Tsai et al. |
| 2020/0234023 A1 | 7/2020 | Tsai et al. |
| 2020/0309615 A1 | 10/2020 | Tsai et al. |
| 2020/0378845 A1 | 12/2020 | Bergemont et al. |
| 2021/0190608 A1 | 6/2021 | Tsai et al. |

FOREIGN PATENT DOCUMENTS

| | | |
|---|---|---|
| CN | 101801837 A | 8/2010 |
| CN | 201653605 U | 11/2010 |
| CN | 101929898 A | 12/2010 |
| CN | 102062662 A | 5/2011 |
| CN | 102853950 A | 1/2013 |
| CN | 102998037 A | 3/2013 |
| CN | 103308239 A | 9/2013 |
| CN | 104535229 A | 4/2015 |
| CN | 104581605 A | 4/2015 |
| CN | 104919293 A | 9/2015 |
| CN | 105934661 A | 9/2016 |
| DE | 102010012441 A1 | 9/2011 |
| JP | 2004156937 A | 6/2004 |
| JP | 2010147268 A | 7/2010 |

(56) References Cited

FOREIGN PATENT DOCUMENTS

| WO | 9310430 | A1 | 5/1993 |
|---|---|---|---|
| WO | 2004113859 | A1 | 12/2004 |
| WO | 2007139695 | A2 | 12/2007 |
| WO | 2011065250 | A1 | 6/2011 |
| WO | 2013067548 | A1 | 5/2013 |
| WO | 2015039811 | A1 | 3/2015 |
| WO | 2015106246 | A1 | 7/2015 |
| WO | 2018148503 | A1 | 8/2018 |
| WO | 2018148510 | A1 | 8/2018 |
| WO | 2019023552 | A1 | 1/2019 |
| WO | 2019079420 | A1 | 4/2019 |

OTHER PUBLICATIONS

Applicant-Initiated Interview Summary for U.S. Appl. No. 16/485,026, dated Aug. 25, 2021, 2 pages.
Notice of Allowance for U.S. Appl. No. 16/485,026, dated Sep. 30, 2021, 8 pages.
Non-Final Office Action for U.S. Appl. No. 16/632,795, dated Feb. 18, 2021, 10 pages.
Notice of Allowance for U.S. Appl. No. 16/632,795, dated Sep. 3, 2021, 7 pages.
Non-Final Office Action for U.S. Appl. No. 16/634,469, dated May 27, 2021, 13 pages.
Notice of Allowance for U.S. Appl. No. 16/634,469, dated Sep. 30, 2021, 8 pages.
Non-Final Office Action for U.S. Appl. No. 16/757,225, dated Oct. 5, 2021, 14 pages.
Notice of Allowance for U.S. Appl. No. 16/757,225, dated May 10, 2022, 9 pages.
Non-Final Office Action for U.S. Appl. No. 16/764,992, dated Jun. 24, 2021, 15 pages.
Final Office Action for U.S. Appl. No. 16/764,992, dated Jan. 19, 2022, 15 pages.
Advisory Action, Examiner-Initiated Interview Summary, and AFCP 2.0 Decision for U.S. Appl. No. 16/764,992, dated Apr. 20, 2022, 5 pages.
International Search Report and Written Opinion for International Patent Application No. PCT/US2018/056245, dated Dec. 27, 2018, 8 pages.
Office Action for Chinese Patent Application No. 2018800601531, dated Apr. 6, 2021, 16 pages.
Communication Pursuant to Rule 164(1) EPC issued for European Application No. 18834426.1, dated Mar. 10, 2021, 16 pages.
Extended European Search Report issued for European Application No. 18834426.1, dated Jun. 10, 2021, 13 pages.
International Search Report and Written Opinion for International Patent Application No. PCT/US2018/042883, dated Dec. 6, 2018, 9 pages.
International Search Report and Written Opinion for International Patent Application No. PCT/US2018/044049, dated Oct. 18, 2018, 11 pages.
Non-Final Office Action for U.S. Appl. No. 16/764,992, dated Jun. 14, 2022, 14 pages.
International Search Report and Written Opinion for International Patent Application No. PCT/US2018/061509, dated Jan. 29, 2019, 8 pages.
Virginia Semiconductors, "The General Properties of Si, Ge, SiGe2, SiO2, and Si3N4," Jun. 2002, www.virginiasemi.com/pdf/generalpropertiesSi62002.pdf, Virginia Semiconductor Inc., 5 pages.
Mei, et al., "Design and Fabrication of an Integrated Three-Dimensional Tactile Sensor for Space Robotic Applications," International Conference on Micro Electro Mechanical Systems, Jan. 1999, Orlando, Florida, IEEE, pp. 112-117.
Nesterov, et al., "Modelling and investigation of the silicon twin design 3D micro probe," Journal of Micromechanics and Microengineering, vol. 15, 2005, IOP Publishing Ltd, pp. 514-520.
First Office Action for Chinese Patent Application No. 201880023913.1, dated Dec. 25, 2020, 22 pages.
Second Office Action for Chinese Patent Application No. 201880023913.1, dated Sep. 10, 2021, 13 pages.
Third Office Action for Chinese Patent Application No. 201880023913.1, dated Apr. 6, 2022, 13 pages.
Extended European Search Report for European Patent Application No. 18751209.0, dated Oct. 22, 2020, 7 pages.
International Search Report and Written Opinion for International Patent Application No. PCT/US2018/017564, dated Jun. 15, 2018, 10 pages.
Non-Final Office Action for U.S. Appl. No. 16/485,016, dated Jun. 12, 2020, 13 pages.
Final Office Action for U.S. Appl. No. 16/485,016, dated Mar. 24, 2021, 10 pages.
Notice of Allowance for U.S. Appl. No. 16/485,016, dated Jul. 9, 2021, 8 pages.
International Search Report and Written Opinion for International Patent Application No. PCT/US2018/017572, dated May 3, 2018, 8 pages.
Non-Final Office Action for U.S. Appl. No. 17/676,477, dated Nov. 23, 2022, 12 pages.
Notice of Allowance for U.S. Patent Application No. 17/51,715, dated Oct. 26, 2022, 13 pages.
Notice of Allowance for U.S. Appl. No. 16/757,225, dated Oct. 6, 2022, 9 pages.
Final Office Action for U.S. Appl. No. 16/764,992, dated Jan. 6, 2023, 13 pages.
Decision of Rejection for Chinese Patent Application No. 201880023913.1, dated Oct. 27, 2022, 9 pages.
Examination Report for European Patent Application No. 18751209.0, dated Dec. 19, 2022, 5 pages.

\* cited by examiner

WAFER BONDED PIEZORESISTIVE AND PIEZOELECTRIC FORCE SENSOR AND RELATED METHODS OF MANUFACTURE

CROSS-REFERENCE TO RELATED APPLICATIONS

This application is a continuation of U.S. patent application Ser. No. 16/634,469, filed on Jan. 27, 2020, which is a national stage application filed under 35 U.S.C. § 371 of PCT/US2018/044049 filed Jul. 27, 2018, which claims the benefit of U.S. provisional patent application No. 62/537,614, filed on Jul. 27, 2017, and entitled "A WAFER BONDING PIEZOELECTRIC FORCE SENSOR AND THE METHOD THEREOF," the disclosures of which is expressly incorporated herein by reference in their entireties.

FIELD OF TECHNOLOGY

The present disclosure relates to microelectromechanical ("MEMS") force sensing with piezoresistive and piezoelectric sensing elements integrated with complementary metal-oxide-semiconductor ("CMOS") circuitry through a bonding process.

BACKGROUND

The combination of both piezoresistive and piezoelectric sensing elements for force sensing applications can provide both high sensitivity and offset information. The integration of the two sensing elements on a single die is challenging with existing foundry capabilities. This problem is exacerbated when various types of piezoelectric materials are included into the integration process. The foundry compatibility and thermal budgets of the process steps pose significant hurdles.

Accordingly, there is a desire to provide a solution that can address the integration issues stated above.

SUMMARY

The present disclosure pertains a MEMS force sensor including both piezoresistive and piezoelectric sensing elements integrated with digital circuitry on the same chip through bonding process. In one exemplary embodiment, both the piezoresistive and the piezoelectric elements are fabricated on one substrate first then bonded to another substrate which contains the CMOS integrated circuitry. In another exemplary embodiment, only the piezoelectric element is fabricated on one substrate while the piezoresistive element is fabricated on another substrate which contains the CMOS integrated circuitry. The piezoresistive element is realized through additional implant or diffusion steps in CMOS process.

An example microelectromechanical ("MEMS") force sensor is described herein. The MEMS force sensor can include a sensor die configured to receive an applied force, where the sensor die can include a plurality of substrates bonded together. The MEMS force sensor can include a piezoresistive sensing element arranged on a first substrate of the sensor die, a piezoelectric sensing element arranged on the first substrate of the sensor die, and digital circuitry arranged on a second substrate of the sensor die. The piezoresistive sensing element can be configured to convert a strain to a first analog electrical signal that is proportional to the strain, and the piezoelectric sensing element can be configured to convert a change in strain to a second analog electrical signal that is proportional to the change in strain. Additionally, the digital circuitry can be configured to convert the first and second analog electrical signals to respective digital electrical output signals.

Another example microelectromechanical ("MEMS") force sensor is described herein. The MEMS force sensor can include a sensor die configured to receive an applied force, where the sensor die can include a plurality of substrates bonded together. The MEMS force sensor can include a piezoresistive sensing element arranged on a first substrate of the sensor die, a piezoelectric sensing element arranged on a second substrate of the sensor die, and digital circuitry arranged on the first substrate of the sensor die. The piezoresistive sensing element can be configured to convert a strain to a first analog electrical signal that is proportional to the strain, and the piezoelectric sensing element can be configured to convert a change in strain to a second analog electrical signal that is proportional to the change in strain. Additionally, the digital circuitry can be configured to convert the first and second analog electrical signals to respective digital electrical output signals.

Additionally or additionally, in some implementations, the piezoresistive sensing element can at least partially overlaps with a solder ball. Alternatively or additionally, the piezoelectric sensing element can at least partially overlaps with a solder ball.

Alternatively or additionally, the piezoresistive sensing element can be formed by diffusion or implantation. In some implementations, the piezoresistive sensing element can be p-type formed on an n-type substrate. Alternatively, the piezoresistive sensing element can be n-type formed in a p-type well on an n-type substrate. In other implementations, the piezoresistive sensing element can be p-type formed in an n-type well on a p-type substrate. Alternatively, the piezoresistive sensing element can be n-type formed on a p-type substrate.

Alternatively or additionally, the piezoelectric sensing element can include at least one of aluminum nitride (AlN), zinc oxide (ZnO), lead zirconate titanate (PZT), lithium niobate (LiNbO3), barium titanate (BaTiO3), sodium potassium niobate (KNN), or polyvinylidene fluoride (PVDF).

An example method for manufacturing a microelectromechanical ("MEMS") force sensor is described herein. The method can include forming a piezoresistive sensing element and a piezoelectric sensing element on a surface of a first substrate; forming digital circuitry on a surface of a second substrate; and bonding the first substrate and the second substrate to form a sensor die. The method can also include etching the first substrate and at least a portion of the second substrate to form a through hole; and creating an electrical connection between at least one of the piezoresistive sensing element or the piezoelectric sensing element formed on the first substrate and the digital circuitry formed on the second substrate via the through hole.

Additionally, the first substrate and the second substrate can be bonded using an adhesive layer.

Another example method for manufacturing a microelectromechanical ("MEMS") force sensor is described herein. The method can include forming a piezoelectric sensing element on a surface of a first substrate; forming a piezoresistive sensing element and digital circuitry on a surface of a second substrate; and bonding the first substrate and the second substrate to form a sensor die. The method can also include etching the first substrate and at least a portion of the second substrate to form a through hole; and creating an electrical connection between the piezoelectric sensing element formed on the first substrate and the digital circuitry formed on the second substrate via the through hole.

Additionally, the first substrate and the second substrate can be bonded using a lower temperature fusion bonding process.

Alternatively or additionally, the step of creating an electrical connection can further include depositing an isolation/barrier layer on at least a portion of a surface of the sensor die; and depositing a metal layer on at least a portion of a surface of the isolation/barrier layer.

Alternatively or additionally, the method can further include depositing a polymer layer on the sensor die, wherein the polymer layer covers the isolation/barrier layer and the metal layer; and etching the polymer layer to form an under bump metallization (UBM) layer.

Alternatively or additionally, the method can further include depositing a second metal layer on the UBM layer.

Alternatively or additionally, the method can further include depositing a solder ball on the second metal layer.

Alternatively or additionally, the first substrate can include a carrier substrate. The method can further include removing the carrier substrate after bonding the first substrate and the second substrate.

Other systems, methods, features and/or advantages will be or may become apparent to one with skill in the art upon examination of the following drawings and detailed description. It is intended that all such additional systems, methods, features and/or advantages be included within this description and be protected by the accompanying claims.

BRIEF DESCRIPTION OF THE FIGURES

The components in the drawings are not necessarily to scale relative to each other. Like reference numerals designate corresponding parts throughout the several views. These and other features of will become more apparent in the detailed description in which reference is made to the appended drawings wherein.

DETAILED DESCRIPTION

The present disclosure can be understood more readily by reference to the following detailed description, examples, drawings, and their previous and following description. However, before the present devices, systems, and/or methods are disclosed and described, it is to be understood that this disclosure is not limited to the specific devices, systems, and/or methods disclosed unless otherwise specified, and, as such, can, of course, vary. It is also to be understood that the terminology used herein is for the purpose of describing particular aspects only and is not intended to be limiting.

The following description is provided as an enabling teaching. To this end, those skilled in the relevant art will recognize and appreciate that many changes can be made, while still obtaining beneficial results. It will also be apparent that some of the desired benefits can be obtained by selecting some of the features without utilizing other features. Accordingly, those who work in the art will recognize that many modifications and adaptations may be possible and can even be desirable in certain circumstances, and are contemplated by this disclosure. Thus, the following description is provided as illustrative of the principles and not in limitation thereof.

As used throughout, the singular forms "a," "an" and "the" include plural referents unless the context clearly dictates otherwise. Thus, for example, reference to "a sensing element" can include two or more such sensing elements unless the context indicates otherwise.

The term "comprising" and variations thereof as used herein is used synonymously with the term "including" and variations thereof and are open, non-limiting terms.

Ranges can be expressed herein as from "about" one particular value, and/or to "about" another particular value. When such a range is expressed, another aspect includes from the one particular value and/or to the other particular value. Similarly, when values are expressed as approximations, by use of the antecedent "about," it will be understood that the particular value forms another aspect. It will be further understood that the endpoints of each of the ranges are significant both in relation to the other endpoint, and independently of the other endpoint.

As used herein, the terms "optional" or "optionally" mean that the subsequently described event or circumstance may or may not occur, and that the description includes instances where said event or circumstance occurs and instances where it does not.

Figure 1:
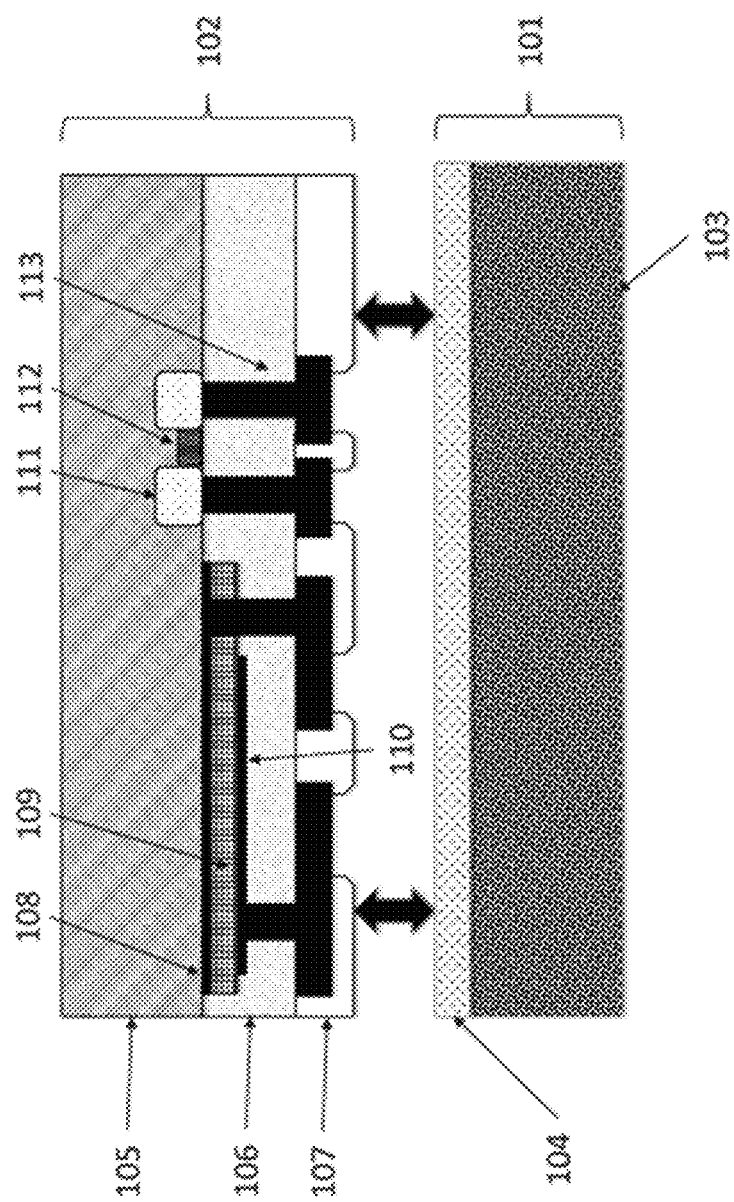
FIG. 1 illustrates a MEMS substrate with piezoresistive and piezoelectric sensing elements and a carrier substrate according to an implementation described herein.

Referring to FIGS. 1-4, the process of bonding a MEMS substrate and a CMOS substrate to create an integrated MEMS force sensor is shown. According to one implementation, the process starts with a MEMS substrate 102 including both piezoresistive and piezoelectric sensing elements and a carrier substrate 101 as shown in FIG. 1. The carrier substrate 101 includes a handle substrate 103 and a MEMS adhesive layer 104. The handle substrate 103 can be made of silicon or other semiconductor material (e.g., gallium arsenide (GaAs)) or glass. The MEMS adhesive layer 104 can be SU-8, PMMA, or other polymer like material. The MEMS substrate 102 includes a sensor substrate 105, a planarized dielectric layer 106, a passivation layer 107, a piezoresistive sensing element 112, and a piezoelectric sensing element. In other words, the piezoelectric and piezoresistive sensing elements are integrated on the same die (i.e., the MEMS substrate 102). The piezoelectric sensing element includes a piezoelectric layer 109 arranged between opposing electrodes 108, 110 (e.g., bottom electrode 108 and top electrode 110). Additionally, the piezoresistive sensing element 112, which is a lightly doped region, is arranged between at least two heavily doped regions 111. A metal interconnection and contact 113 is used to provide electrical connection to the piezoresistive sensing element 112. Although one piezoelectric sensing element and one piezoresistive sensing element are shown in FIG. 1 as examples, this disclosure contemplates that the MEMS substrate 102 can include more than one piezoelectric sensing elements and/or more than one piezoresistive sensing element.

In FIGS. 1-4, the sensor substrate 105 can be made of an n-type semiconductor material such as n-type silicon or other semiconductor (e.g., gallium arsenide (GaAs) or silicon carbide (SiC)). In these implementations, the piezoresistive sensing element 112 can be formed by diffusion or implantation onto the n-type substrate. For example, as shown in FIG. 1, the piezoresistive sensing element 112 can be a lightly doped p-type region arranged between heavily doped p-type regions 111. Alternatively, the piezoresistive sensing element 112 can be a lightly doped n-type region arranged between heavily doped n-type regions 111, all formed inside a p-type well (not shown). In other implementations, the sensor substrate 105 can be made of a p-type semiconductor material such as p-type silicon or other semiconductor (e.g., gallium arsenide (GaAs) or silicon carbide (SiC)). In these implementations, the piezoresistive sensing element 112 can be formed by diffusion or implantation onto the p-type substrate. For example, as shown in FIG. 1, the piezoresistive element 112 can be a lightly doped n-type region arranged between heavily doped n-type regions 111. Alternatively, the piezoresistive sensing element 112 can be a lightly-doped p-type region arranged between heavily doped p-type regions 111, all formed in a n-type well (not shown). Optionally, the piezoresistive sensing element 112 can be fully or partially covered by a solder ball (or solder bump), which is placed as described below with regard to FIG. 4. In other words, the respective areas of the sensor die on which the piezoresistive sensing element and solder ball are located can fully or partially overlap with one another. This is where the maximum response is available.

The piezoresistive sensing element 112 can change resistance in response to deflection of a portion of the MEMS substrate 102. For example, as strain is induced in the MEMS substrate 102 proportional to the force applied to a MEMS force sensor, a localized strain is produced on a piezoresistive sensing element such that the piezoresistive sensing element experiences compression or tension, depending on its specific orientation. As the piezoresistive sensing element compresses and tenses, its resistivity changes in opposite fashion. Accordingly, a Wheatstone bridge circuit including a plurality (e.g., four) piezoresistive sensing elements (e.g., two of each orientation relative to strain) becomes unbalanced and produces a differential voltage. This differential voltage is directly proportional to the force applied to the MEMS force sensor. This differential voltage can represent the static force applied to the MEMS force sensor. This disclosure contemplates that this differential voltage can be received at and processed by digital circuitry (described herein). For example, the digital circuitry can be configured to, among other functions, convert an analog electrical signal to a digital electrical output signal. Example MEMS force sensors using piezoresistive sensing elements are described in U.S. Pat. No. 9,487,388, issued Nov. 8, 2016 and entitled "Ruggedized MEMS Force Die;" U.S. Pat. No. 9,493,342, issued Nov. 15, 2016 and entitled "Wafer Level MEMS Force Dies;" U.S. Pat. No. 9,902,611, issued Feb. 27, 2018 and entitled "Miniaturized and ruggedized wafer level mems force sensors;" and U.S. Patent Application Publication No. 2016/0363490 to Campbell et al., filed Jun. 10, 2016 and entitled "Ruggedized wafer level mems force sensor with a tolerance trench," the disclosures of which are incorporated by reference in their entireties.

As described above, the piezoelectric sensing element can include the piezoelectric layer 109 arranged between opposing electrodes 108, 110 (e.g., bottom electrode 108 and top electrode 110). The piezoelectric layer 109 can be made of at least one of aluminum nitride (AlN), zinc oxide (ZnO), lead zirconate titanate (PZT), lithium niobate (LiNbO3), barium titanate (BaTiO3), sodium potassium niobate (KNN), or polyvinylidene fluoride (PVDF). When a force is applied to a MEMS force sensor, the strain is transferred to piezoelectric element 109, which converts the strain into charge. In other words, the piezoelectric element 109 can change an electrical characteristic (i.e., charge) in response to deflection of a portion of the MEMS substrate 102. Thus, the change in electrical characteristic can be detected as an analog electrical signal (e.g., change in voltage) at the opposing electrodes 108, 110. This disclosure contemplates that this analog electrical signal can be received at and processed by digital circuitry (described herein). For example, the digital circuitry can be configured to, among other functions, convert an analog electrical signal to a digital signal. The voltage measured at the opposing electrodes 108, 110 of the piezoelectric sensing element can represent the dynamic force applied to the MEMS force sensor. This information can be used in conjunction with the differential voltage signal described above, which represents the static force applied to the MEMS force sensor, to improve sensitivity and accuracy of the MEMS force sensor. An example integrated fusion force sensor is described in detail in PCT/US2018/017572, filed on Feb. 9, 2018, and entitled "INTEGRATED PIEZORESISTIVE AND PIEZOELECTRIC FUSION FORCE SENSOR," the disclosure of which is incorporated by reference in its entirety. Optionally, the piezoelectric sensing element can be fully or partially covered by a solder ball, which is placed as described below with regard to FIG. 4. In other words, the respective areas of the sensor die on which the piezoelectric sensing element and solder ball are located can fully or partially overlap with one another. This is where the maximum response is available.

Figure 2:
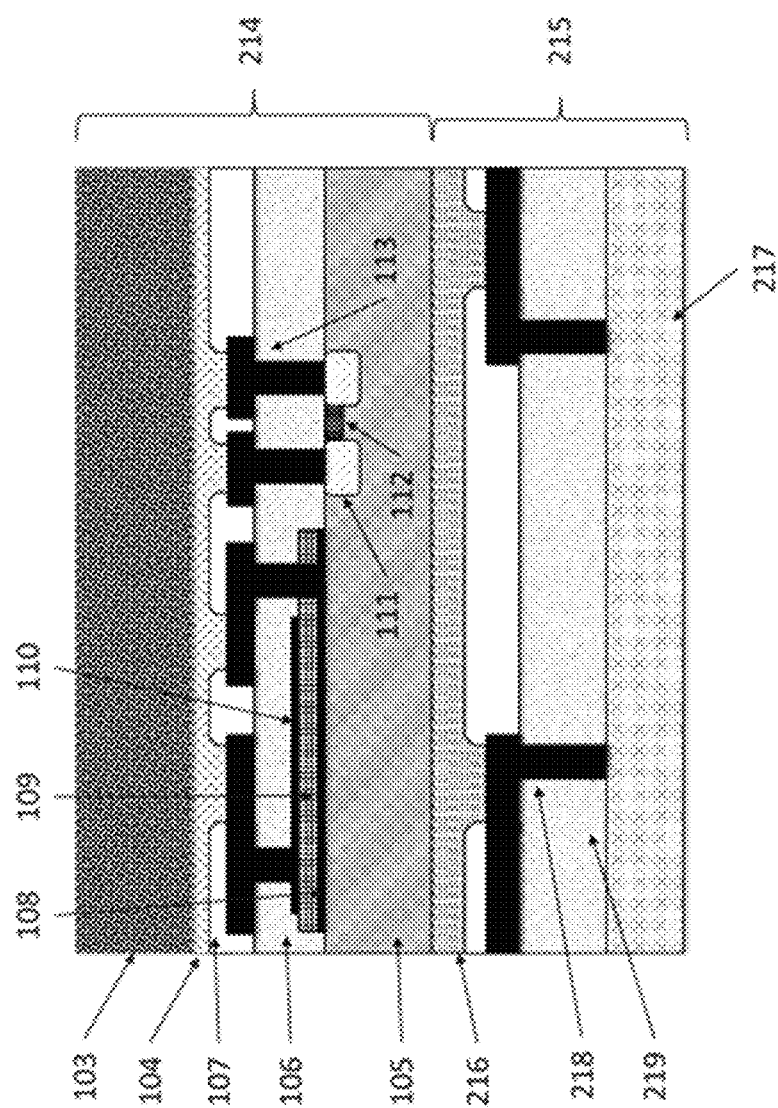
FIG. 2 illustrates bonding of the MEMS and carrier substrates shown in FIG. 1 to a CMOS substrate with integrated circuitry according to an implementation described herein.

The MEMS substrate 102 and the carrier substrate 101 can be bonded together. For example, the MEMS substrate 102 and the carrier substrate 101 can be bonded together using the MEMS adhesive layer 104. The bonded MEMS and carrier substrates forms an intermediate MEMS substrate 214 as shown in FIG. 2. Then, the intermediate MEMS substrate 214 can be bonded to a CMOS substrate 215. The bonded MEMS and CMOS substrates form a sensor die. The CMOS substrate 215 includes an adhesive layer 216, a circuit substrate 217, a planarized dielectric layer 219, and a metal interconnection and contact 218. The adhesive layer 216 can be made of SU-8, PMMA, or other polymer like material. As shown in FIG. 2, the intermediate MEMS substrate 214 can be bonded to the CMOS substrate 215 using the adhesive layer 216. This disclosure contemplates that a plurality of an n-type metal-oxide-semiconductor (nMOS) transistors and/or a p-type metal-oxide-semiconductor (pMOS) transistors can be fabricated on the circuit substrate 217 using CMOS processes, which are known in the art. The circuit substrate 217 can be made of silicon. Although a silicon substrate is provided as an example, this disclosure contemplates that the circuit substrate 217 can be made from a material other than silicon (e.g., glass, ceramic, etc.). The nMOS and pMOS transistors can form digital circuitry (also sometimes referred to as "integrated circuits (IC)"). The nMOS and pMOS transistors can form various components of the digital circuitry. The digital circuitry can optionally include other components including, but not limited to, bipolar transistors; metal-insulator-metal ("MIM") and metal-oxide-semiconductor ("MOS") capacitors; diffused, implanted, and polysilicon resistors; and/or diodes. The digital circuitry can include, but is not limited to, one or more of a differential amplifier or buffer, an analog-to-digital converter, a clock generator, non-volatile memory, and a communication bus. The metal interconnection and contact 218 can be used to provide electrical connection to the digital circuitry. It should be understood that the number of metal interconnection and contacts shown in FIG. 2 (i.e., two) are provided only as an example.

Figure 3:
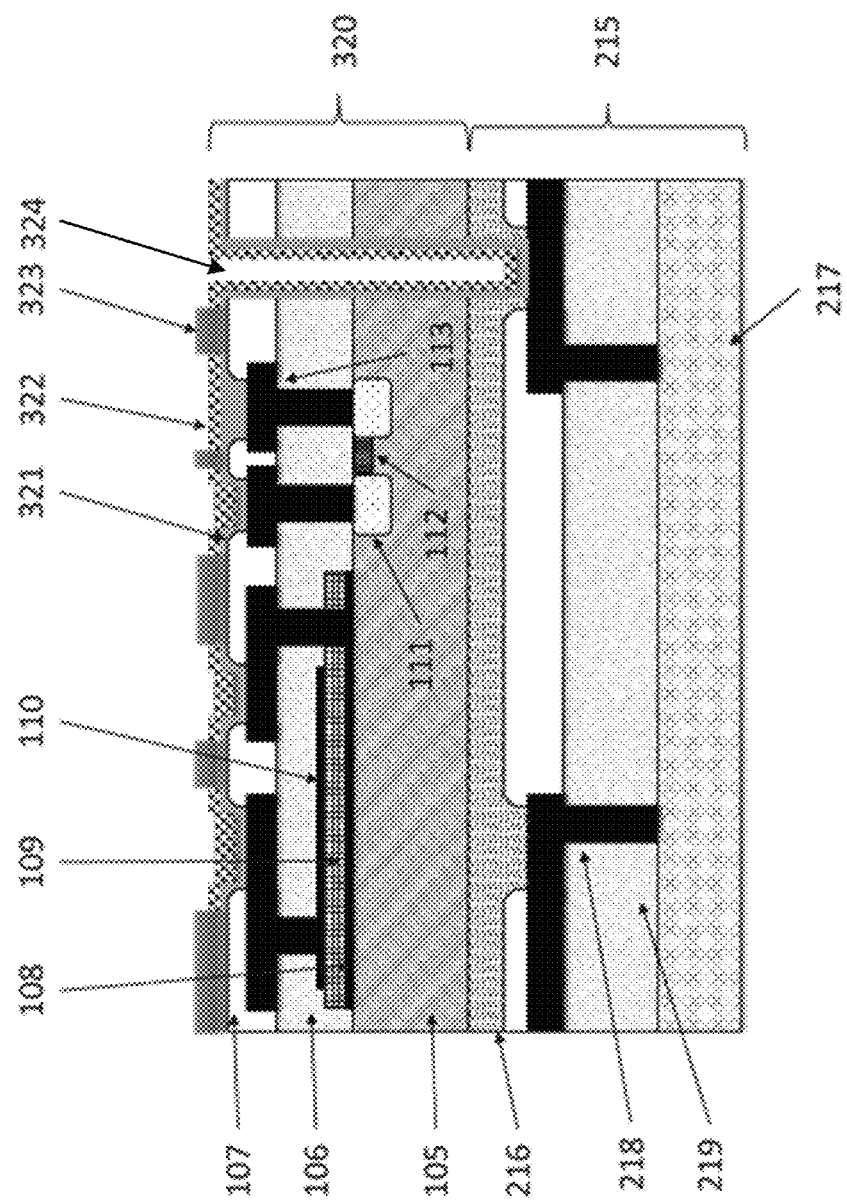
FIG. 3 illustrates removal of the carrier substrate to create an intermediate MEMS substrate and creation of an isolation/barrier layer and metal plating for electrical interconnection according to an implementation described herein.

As shown in FIG. 3, the carrier substrate and the MEMS adhesive layer can be removed, which leaves a bonded MEMS substrate 320. Thereafter, a through hole 324 can be created by etching through the bonded MEMS substrate 320 and the adhesive layer 216 of the CMOS substrate 215 until the metal interconnect and contact 218 is exposed. Although a single through hole 324 is shown in FIG. 3, it should be understood that the MEMS force sensor can include more than one through hole. The through hole(s) facilitate providing an electrical connection between the force sensing elements (e.g., the piezoresistive and/or piezoelectric sensing elements), which are fabricated on the bonded MEMS substrate 320, and the digital circuitry, which is arranged on the CMOS substrate 215. After creating the through hole 324, an isolation/barrier layer 321 can be deposited onto portions of the bonded MEMS substrate 320, followed by deposition of a metal layer 322 (e.g., copper) onto portions of the isolation/barrier layer 321. The metal layer 322 can be deposited in desired locations using a plating mask layer 323 as shown in FIG. 3.

Figure 4:
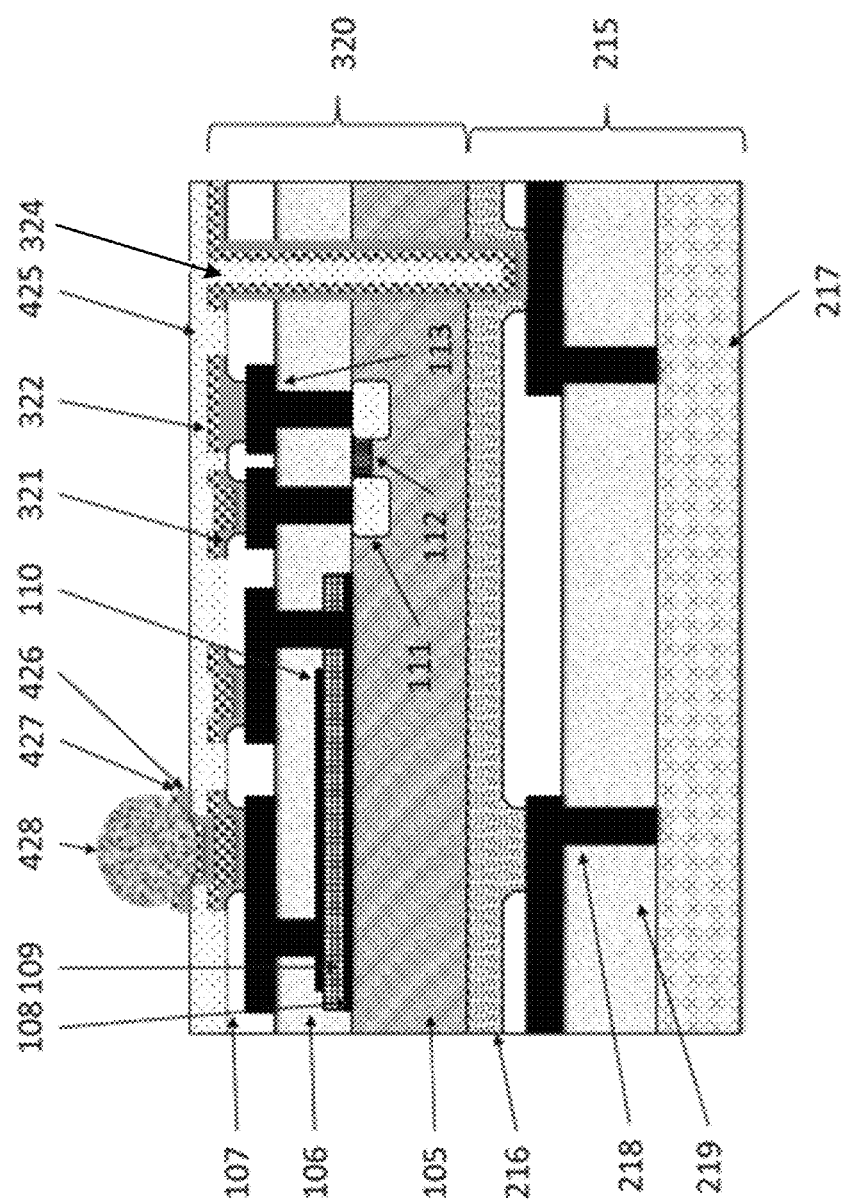
FIG. 4 illustrates a cross-sectional view of the completed MEMS force sensor including the MEMS substrate with the piezoresistive and piezoelectric sensing elements bonded to the CMOS substrate with integrated circuitry according to an implementation described herein.

A cross section of the completed MEMS force sensor is shown in FIG. 4. As shown in this figure, the plating mask layer can be removed, and a polymer layer 425 can be deposited onto the bonded MEMS substrate 320 and then etched to create an under bump metallization (UBM) layer 426. A metal layer 427 (e.g., copper) can be disposed on the UBM layer 426. Then, a solder ball 428 can be placed as depicted in FIG. 4. It should be understood that the solder ball 428 can be used to provide electrical and/or mechanical connection between the MEMS force sensor depicted in FIG. 4 and an external device (e.g., an electronic device) or external substrate.

Figure 5:
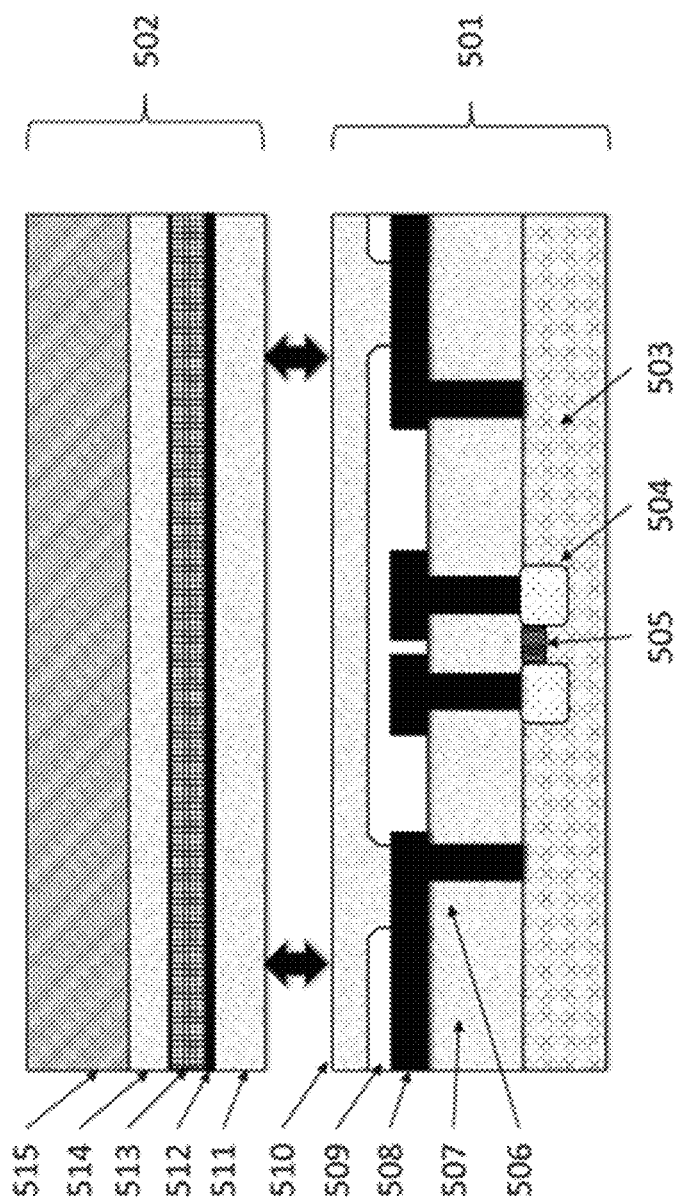
FIG. 5 illustrates a MEMS substrate with a piezoelectric sensing element and a CMOS substrate with integrated circuitry and a piezoresistive sensing element according to an implementation described herein.

Referring now to FIGS. 5-8, another process of bonding a MEMS substrate and a CMOS substrate to create an integrated MEMS force sensor is shown. According to this implementation, the process starts with a MEMS substrate 502 including a piezoelectric sensing element and a carrier substrate 515 as shown in FIG. 5. The MEMS substrate 502 further includes a first planarized dielectric layer 514, a piezoelectric layer 513, a bottom electrode 512, and a second planarized dielectric layer 511. The piezoelectric layer 513 can be made of at least one of aluminum nitride (AlN), zinc oxide (ZnO), lead zirconate titanate (PZT), lithium niobate (LiNbO3), barium titanate (BaTiO3), sodium potassium niobate (KNN), or polyvinylidene fluoride (PVDF).

As shown in FIG. 5, the MEMS substrate 502 can be bonded to a CMOS substrate 501 using a lower temperature fusion bonding process such that performance of the circuitry integrated in the CMOS substrate 501 (e.g., digital circuitry described herein) is not affected during the bonding process. The bonded MEMS and CMOS substrates form a sensor die. The CMOS substrate 501 can include a circuit substrate 503, a piezoresistive sensing element 505, an intermetal dielectric (IMD) layer 507, a metal layer 508, a passivation layer 509, a planarized dielectric layer 510, and a via 506. The via 506 can connect the metal layer 508 to the digital circuitry formed on the circuit substrate 503. It should be understood that the numbers of vias and/or metal layers shown in FIGS. 5-8 are provided only as examples and that this disclosure contemplates that more or less vias and/or metal layers can be used to provide electrical connection to the digital circuitry.

This disclosure contemplates that a plurality of an n-type metal-oxide-semiconductor (nMOS) transistors and/or a p-type metal-oxide-semiconductor (pMOS) transistors can be fabricated on the circuit substrate 503 using CMOS processes, which are known in the art. The circuit substrate 503 can be made of silicon. Although a silicon substrate is provided as an example, this disclosure contemplates that the circuit substrate 503 can be made from a material other than silicon (e.g., glass, ceramic, etc.). The nMOS and pMOS transistors can form digital circuitry. The nMOS and pMOS transistors can form various components of the digital circuitry. The digital circuitry can optionally include other components including, but not limited to, bipolar transistors; metal-insulator-metal ("MIM") and metal-oxide-semiconductor ("MOS") capacitors; diffused, implanted, and polysilicon resistors; and/or diodes. The digital circuitry can include, but is not limited to, one or more of a differential amplifier or buffer, an analog-to-digital converter, a clock generator, non-volatile memory, and a communication bus.

The piezoresistive sensing element 505, which is a lightly doped region, is arranged between at least two heavily doped regions 504. A metal interconnection and contact can be used to provide electrical connection to the piezoresistive element 505. Although one piezoresistive sensing element is shown in the figures as an example, this disclosure contemplates that the CMOS substrate 501 can include more than one more than one piezoresistive sensing element. The piezoresistive sensing element 505 and heavily doped regions 504 can be formed on the circuit substrate 503 by deposition or implantation process on p-type or n-type substrates as described above. Additionally, the piezoresistive sensing element 505 can be formed using processes compatible with the CMOS processes used to form the digital circuitry. Formation of piezoresistive sensing elements with processes compatible with CMOS processes are described in detail in PCT/US2018/017564, filed on Feb. 9, 2018, and entitled "INTEGRATED DIGITAL FORCE SENSORS AND RELATED METHODS OF MANUFACTURE." Further, piezoresistive force sensing is described in detail above with regard to FIGS. 1-4. Optionally, the piezoresistive sensing element 505 can be fully or partially covered by a solder ball (or solder bump), which is placed as described below with regard to FIG. 8. In other words, the respective areas of the sensor die on which the piezoresistive sensing element and solder ball are located can fully or partially overlap with one another. This is where the maximum response is available.

Figure 6:
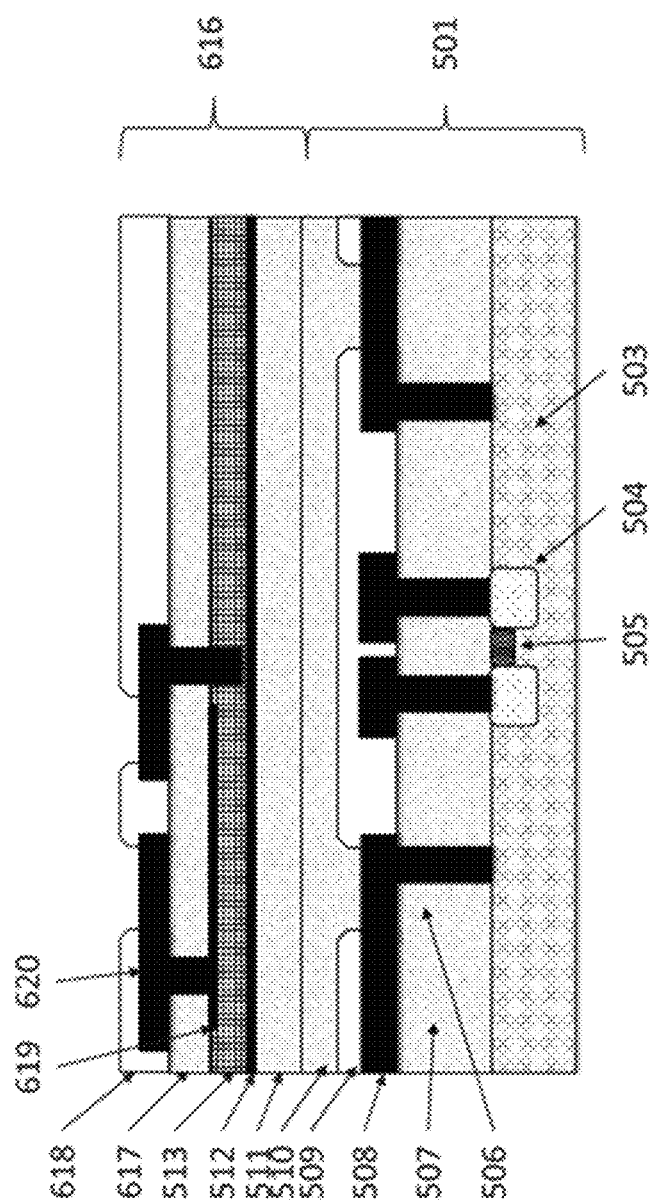
FIG. 6 illustrates bonding of the MEMS substrate and the CMOS substrate shown in FIG. 5, removal of the carrier substrate and dielectric layer, and creation of metallization for the piezoelectric sensing element according to an implementation described herein.

Referring now to FIG. 6, the carrier substrate and the first planarized dielectric layer can be removed. Thereafter, a top electrode 619, another (e.g., third) planarized dielectric layer 617, a passivation layer 618, and a metal interconnect and contact 620 can be formed on the MEMS substrate. This results in a bonded MEMS substrate 616 as shown in FIG. 6. As depicted in the figure, a piezoelectric sensing element can include the piezoelectric layer 513 arranged between opposing electrodes 512, 619 (e.g., bottom electrode 512 and top electrode 619). Although one piezoelectric sensing element is shown in the figures as an example, this disclosure contemplates that the bonded MEMS substrate 616 can include more than one piezoelectric sensing element. Piezoelectric force sensing is described in detail above with regard to FIGS. 1-4. Optionally, the piezoelectric sensing element can be fully or partially covered by a solder ball, which is placed as described below with regard to FIG. 8. In other words, the respective areas of the sensor die on which the piezoelectric sensing element and solder ball are located can fully or partially overlap with one another. This is where the maximum response is available.

Figure 7:
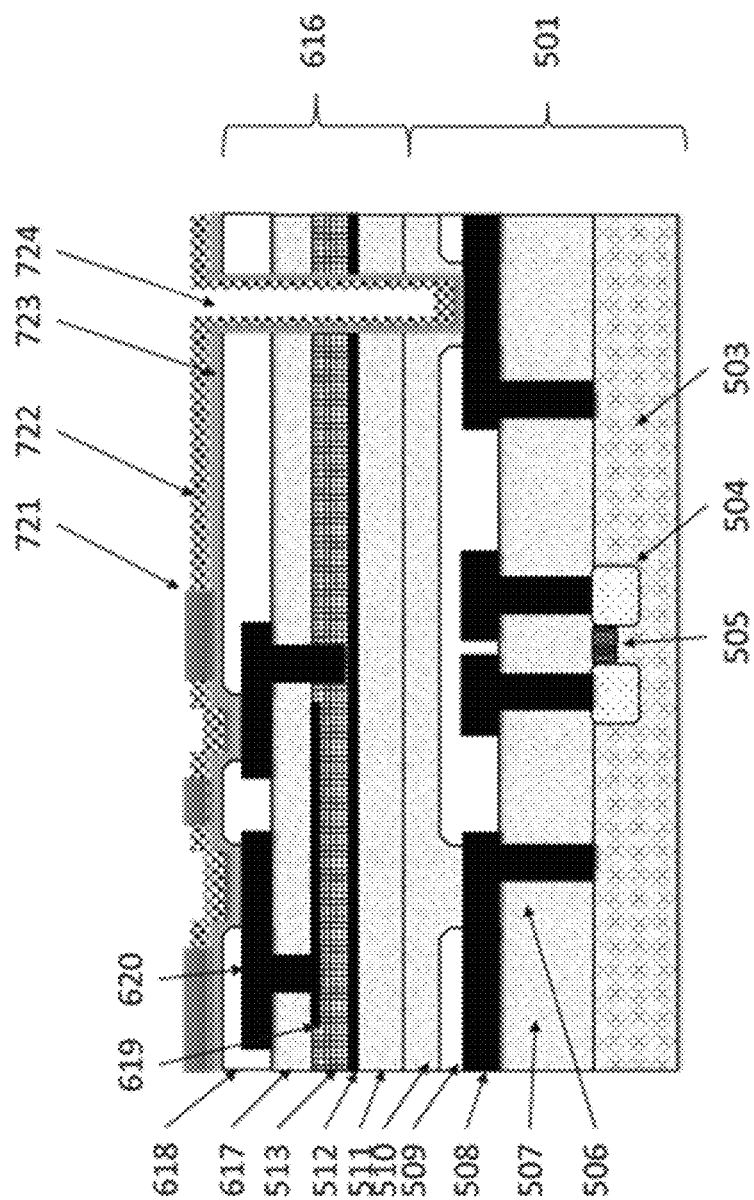
FIG. 7 illustrates creation of an isolation/barrier layer and metal plating for electrical interconnection according to an implementation described herein.

Referring now to FIG. 7, a through hole 724 can be created by etching through the bonded MEMS substrate 616 and portions of the CMOS substrate 501 (e.g., the planarized dielectric layer 510) until the metal layer 508 is exposed. Although a single through hole 724 is shown in FIG. 7, it should be understood that the MEMS force sensor can include more than one through hole. The through hole(s) facilitate providing an electrical connection between the force sensing elements (e.g., the piezoelectric sensing elements), which are fabricated on the bonded MEMS substrate 616, and the piezoresistive sensing element 505 and/or digital circuitry, which are arranged on the CMOS substrate 501. After creating the through hole 724, an isolation/barrier layer 723 can be deposited onto portions of the bonded MEMS substrate 616, followed by deposition of a metal layer 722 (e.g., copper) onto portions of the isolation/barrier layer 723. The metal layer 722 can be deposited in desired locations using a plating mask layer 721 as shown in FIG. 7.

Figure 8:
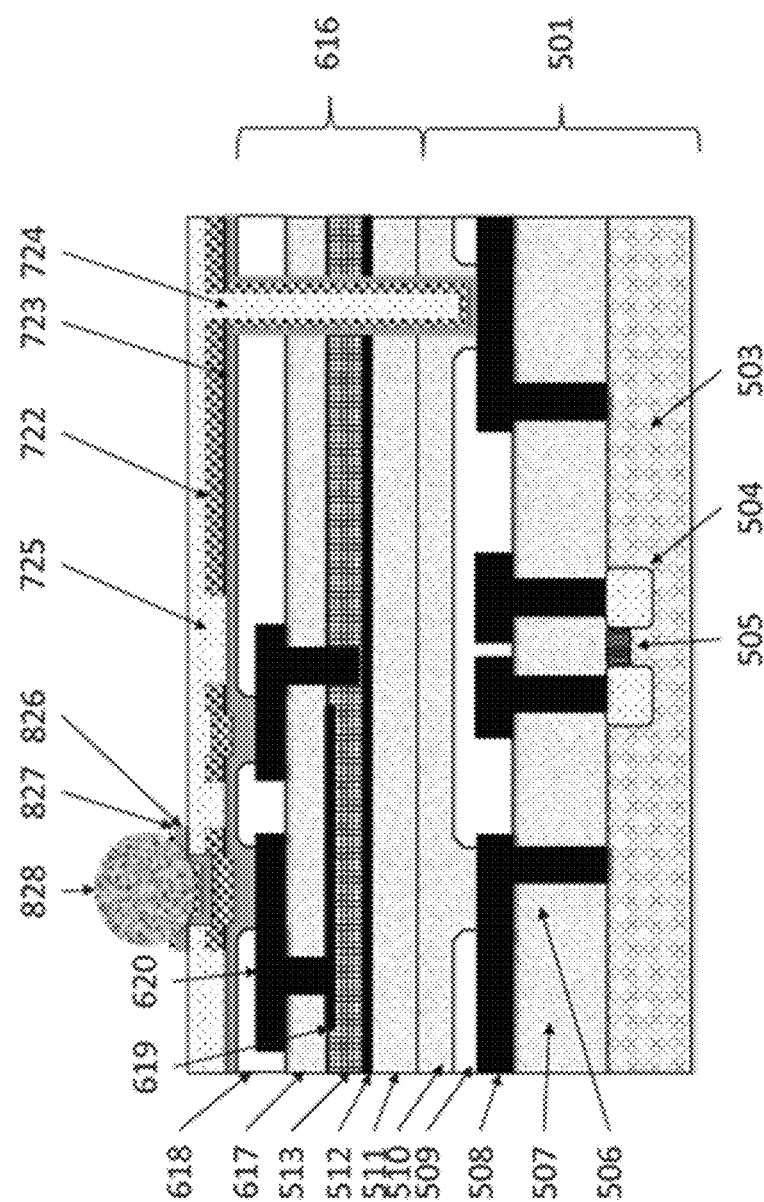
FIG. 8 illustrates a cross-sectional view of the completed MEMS force sensor including the MEMS substrate with the piezoelectric sensing element bonded to the CMOS substrate with integrated circuitry and the piezoresistive sensing element according to an implementation described herein.

A cross section of the completed MEMS force sensor is shown in FIG. 8. As shown in this figure, the plating mask layer can be removed, and a polymer layer 725 can be deposited onto the bonded MEMS substrate 616 and then etched to create an under bump metallization (UBM) layer 826. A metal layer 827 (e.g., copper) can be disposed on the UBM layer 826. Then, a solder ball 828 can be placed as depicted in FIG. 8. It should be understood that the solder ball 828 can be used to provide electrical and/or mechanical connection between the MEMS force sensor depicted in FIG. 8 and an external device (e.g., an electronic device) or external substrate.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

The invention claimed is:

1. A microelectromechanical ("MEMS") force sensor, comprising:
a sensor die configured to receive an applied force;
a piezoresistive sensing element on the sensor die, wherein the piezoresistive sensing element is configured to convert a strain to a first analog electrical signal that is proportional to the strain;
a piezoelectric sensing element on the sensor die at least partially overlapping a solder bump, wherein the piezoelectric sensing element is configured to convert a change in strain to a second analog electrical signal that is proportional to the change in strain; and
circuitry arranged in the sensor die, wherein the circuitry is configured to convert the first analog electrical signal and the second analog electrical signal to respective digital electrical output signals.

2. The MEMS force sensor of claim 1, wherein:
the sensor die comprises a plurality of substrates bonded together;
the piezoresistive sensing element is on a first substrate of the sensor die; and
the piezoelectric sensing element is on the first substrate of the sensor die and at least partially overlaps the solder bump.

3. The MEMS force sensor of claim 1, wherein:
the sensor die comprises a plurality of substrates bonded together;
the piezoresistive sensing element is on a first substrate of the sensor die; and
the piezoelectric sensing element is on a second substrate of the sensor die and at least partially overlaps the solder bump.

4. The MEMS force sensor of claim 1, wherein the piezoresistive sensing element at least partially overlaps a solder ball.

5. The MEMS force sensor of claim 1, wherein the piezoresistive sensing element comprises one of:
a p-type piezoresistive sensing element formed on an n-type substrate;
a p-type piezoresistive sensing element formed in an n-type well on a p-type substrate
an n-type piezoresistive sensing element formed on a p-type substrate; or
an n-type piezoresistive sensing element formed in a p-type well on an n-type substrate.

6. The MEMS force sensor of claim 1, wherein the piezoelectric sensing element comprises a piezoelectric layer between opposing electrodes.

7. The MEMS force sensor of claim 6, wherein the piezoelectric layer comprises at least one of aluminum nitride (AlN), zinc oxide (ZnO), lead zirconate titanate (PZT), lithium niobate (LiNbO3), barium titanate (BaTiO3), sodium potassium niobate (KNN), or polyvinylidene fluoride (PVDF).

8. A method for manufacturing a microelectromechanical ("MEMS") force sensor, comprising:
forming a piezoresistive sensing element and a piezoelectric sensing element on a first substrate;
forming circuitry on a second substrate;
bonding the first substrate and the second substrate to form a sensor die;
forming a through hole in the first substrate and in at least a portion of the second substrate; and
creating an electrical connection between at least one of the piezoresistive sensing element or the piezoelectric sensing element formed on the first substrate and the circuitry formed on the second substrate via the through hole.

9. The method of claim 8, further comprising:

prior to bonding the first substrate to the second substrate, bonding a carrier substrate to the first substrate; and removing the carrier substrate after the sensor die is formed.

10. The method of claim 8, wherein creating the electrical connection between at least one of the piezoresistive sensing element or the piezoelectric sensing element formed on the first substrate and the circuitry formed on the second substrate via the through hole comprises:

forming an isolation layer or a barrier layer on at least a portion of a surface of the sensor die; and forming a metal layer on at least a portion of a surface of the isolation layer or the barrier layer.

11. The method of claim 10, further comprising:

forming a polymer layer on the sensor die, wherein the polymer layer covers the isolation/barrier layer and the metal layer;

etching the polymer layer to form an under bump metallization (UBM) layer;

forming a second metal layer on the UBM layer; and forming a solder ball on the second metal layer.

12. The method of claim 8, further comprising at least one of:

forming a solder ball over the sensor die such that the solder ball at least partially overlaps the piezoelectric sensing element; or forming a solder ball over the sensor die such that the solder ball at least partially overlaps the piezoresistive sensing element.

13. The method of claim 8, wherein:

the piezoresistive sensing element comprises a lightly doped region formed between at least two heavily doped regions; and the piezoresistive sensing element is formed by diffusion or implantation.

14. A method for manufacturing a microelectromechanical ("MEMS") force sensor, comprising:

forming a piezoelectric sensing element on a first substrate;

forming a piezoresistive sensing element and circuitry on a second substrate;

bonding the first substrate and the second substrate to form a sensor die;

forming a through hole in the first substrate and at least a portion of the second substrate; and creating an electrical connection between the piezoelectric sensing element formed on the first substrate and the circuitry formed on the second substrate via the through hole.

15. The method of claim 14, wherein bonding the first substrate and the second substrate to form the sensor die comprises bonding, using a lower temperature fusion bonding process, the first substrate, and the second substrate to form the sensor die.

16. The method of claim 14, wherein creating the electrical connection between the piezoelectric sensing element formed on the first substrate and the circuitry formed on the second substrate via the through hole comprises:

forming an isolation/barrier layer on at least a portion of a surface of the sensor die; and forming a metal layer on at least a portion of a surface of the isolation/barrier layer.

17. The method of claim 16, further comprising:

forming a polymer layer on the sensor die, wherein the polymer layer covers the isolation/barrier layer and the metal layer;

etching the polymer layer to form an under bump metallization (UBM) layer;

forming a second metal layer on the UBM layer; and forming a solder ball on the second metal layer.

18. The method of claim 14, further comprising at least one of:

forming a solder ball over the sensor die such that the solder ball at least partially overlaps the piezoelectric sensing element; or forming a solder ball over the sensor die such that the solder ball at least partially overlaps the piezoresistive sensing element.

19. The method of claim 14, further comprising:

prior to bonding the first substrate to the second substrate, bonding a carrier substrate to the second substrate; and removing the carrier substrate after the first substrate is bonded to the second substrate.

20. The method of claim 14, wherein forming the piezoresistive sensing element on the surface of the second substrate comprises forming a lightly doped region between at least two heavily doped regions in the second substrate.

* * * * *